United States Patent
Luo et al.

(10) Patent No.: US 12,216,175 B2
(45) Date of Patent: Feb. 4, 2025

(54) STORAGE BATTERY MONITORING SYSTEM AND METHOD

(71) Applicant: CONTEMPORARY AMPEREX TECHNOLOGY (HONG KONG) LIMITED, Hong Kong (CN)

(72) Inventors: Huixiu Luo, Ningde (CN); Yu Liu, Ningde (CN); Qidong Lou, Ningde (CN); Qiandeng Li, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 747 days.

(21) Appl. No.: 17/433,998

(22) PCT Filed: Feb. 25, 2020

(86) PCT No.: PCT/CN2020/076545
§ 371 (c)(1),
(2) Date: Aug. 25, 2021

(87) PCT Pub. No.: WO2020/173421
PCT Pub. Date: Sep. 3, 2020

(65) Prior Publication Data
US 2022/0137152 A1    May 5, 2022

(30) Foreign Application Priority Data
Feb. 26, 2019    (CN) .................. 201910142835.3

(51) Int. Cl.
*H01M 10/42*    (2006.01)
*G01R 31/396*    (2019.01)
*H01M 10/48*    (2006.01)

(52) U.S. Cl.
CPC ........ *G01R 31/396* (2019.01); *H01M 10/482* (2013.01); *H01M 2010/4278* (2013.01)

(58) Field of Classification Search
CPC .............. G01R 31/396; H01M 10/482; H01M 2010/4278
See application file for complete search history.

(56) References Cited

U.S. PATENT DOCUMENTS 5,469,042 A    11/1995    Ruhling
8,089,248 B2    1/2012    Tabatowski-Bush
(Continued)

FOREIGN PATENT DOCUMENTS

CN    101860053 A    10/2010
CN    104124729 A    10/2014
(Continued)

OTHER PUBLICATIONS

Contemporary Amperex Technology Co., Limited, Extended European Search Report, EP 20762090.7, Feb. 18, 2022, 9 pgs.
(Continued)

*Primary Examiner* — Robert Grant
(74) *Attorney, Agent, or Firm* — Anova Law Group, PLLC (57) ABSTRACT

A storage battery monitoring system and method are provided. The system includes n cell monitoring cells (CMCs), a control module (11), and several daisy chain buses. The n CMCs are configured to monitor a plurality of cell modules electrically connected in a storage battery, and each CMC is configured to monitor at least one of the cell modules. The n CMCs are connected to the control module (11) through each daisy chain bus. The control module is configured to receive monitoring data of the plurality of cell modules uploaded by the n CMCs through a transmission path formed by at least one daisy chain bus. The control module (11) is further configured to identify a fault location according to the monitoring data when a fault occurring to the transmission path is detected, and adjust the transmission
(Continued)

path according to the fault location so as to receive the monitoring data.

15 Claims, 7 Drawing Sheets

(56) References Cited

U.S. PATENT DOCUMENTS

| | | | |
|---|---|---|---|
| 2011/0057659 A1 | 3/2011 | Ishikawa et al. | |
| 2011/0145629 A1 | 6/2011 | Li et al. | |
| 2014/0129164 A1 | 5/2014 | Gorbold | |
| 2015/0333541 A1* | 11/2015 | Butzmann | H01M 10/425 320/112 |
| 2018/0372804 A1* | 12/2018 | Yamazaki | G01R 31/36 |
| 2019/0006723 A1 | 1/2019 | Martin et al. | |

FOREIGN PATENT DOCUMENTS

| | | |
|---|---|---|
| CN | 104300593 A | 1/2015 |
| CN | 104553852 A | 4/2015 |
| CN | 104579875 A | 4/2015 |
| CN | 104579876 A | 4/2015 |
| CN | 103299652 B | 11/2016 |
| CN | 107770025 A | 3/2018 |
| CN | 207311148 U | 5/2018 |
| CN | 109116262 A | 1/2019 |
| CN | 110967641 A | 4/2020 |
| DE | 102012222720 A1 | 6/2014 |
| JP | 2001310281 A | 11/2001 |
| JP | 2013104842 A | 5/2013 |
| JP | 2014215136 A | 11/2014 |
| JP | 2014215137 A | 11/2014 |
| JP | 2015100179 A | 5/2015 |
| JP | 2018194336 A | 12/2018 |
| KR | 20190010003 A | 1/2019 |

OTHER PUBLICATIONS

The World Intellectual Property Organization (WIPO) International Search Report and Written Opinion for PCT/CN2020/076545 May 29, 2020 15 pages (with translation).
The European Patent Office (EPO) Office Action for EP 20762090.7, Jul. 22, 2022 7 pages.
The European Patent Office (EPO) Office Action for EP 20762090.7, May 11, 2023 8 pages.
The China National Intellectual Property Administration (CNIPA) The Second Office Action for CN application No. 201910142835.3, Oct. 13, 2020 9 pages (with translation).
The China National Intellectual Property Administration (CNIPA) Notification to Grant Patent Right for Invention for CN application No. 201910142835.3, Dec. 16, 2020 2 pages (with translation).
The China National Intellectual Property Administration (CNIPA) The First Office Action for CN application No. 201910142835.3, Jul. 23, 2020 22 pages (with translation).
The China National Intellectual Property Administration (CNIPA) The First Search for CN application No. 201910142835.3, Jul. 14, 2020 3 pages.
Contemporary Amperex Technology Co., Limited, International Search Report, PCT/CN2020/076545, May 29, 2020, 8 pgs.
Contemporary Amperex Technology Co., Limited, CN First Office Action, CN 201910142835.3, Jul. 23, 2020, 14 pgs.

* cited by examiner

STORAGE BATTERY MONITORING SYSTEM AND METHOD

CROSS REFERENCE TO RELATED APPLICATIONS

The present application is a United States National Stage Application filed under 35 U.S.C. § 371 of PCT Patent Application Serial No. PCT/CN2020/076545, entitled "STORAGE BATTERY MONITORING SYSTEM AND METHOD", filed Feb. 25, 2020, which claims priority to Chinese Patent Application No. 201910142835.3, entitled "STORAGE BATTERY MONITORING SYSTEM AND METHOD," filed Feb. 26, 2019, each of which is incorporated by reference herein in its entirety.

TECHNICAL FIELD

The embodiments of the present disclosure relate to the field of battery monitoring technology, in particular to a storage battery monitoring system and method.

BACKGROUND

As the driving power of an electric vehicle, the working state of a storage battery directly affects the safety performance of the electric vehicle, so it is particularly important to use a storage battery management system to monitor the storage battery. At present, the storage battery management system mostly use a communication mode based on a CAN bus or single chain daisy chain. The daisy chain communication mode may make up for the unpredictability, channel error and blockage and other defects in a CAN bus system to a certain extent, and may improve EMC performance.

The inventor finds that there are at least the following problems in the existing technology: what is used in the daisy chain is a cascaded serial transmission communication. When a failure occurs to a certain place in a data chain (a transmission line itself or a certain device), it may lead to a communication failure and an abnormality.

SUMMARY

Embodiments of the present disclosure are intended to provide a storage battery monitoring system and method, which can avoid the problem of communication failure due to the occurrence of a fault in a current transmission path and improve safety.

To solve the above technical problems, some embodiments of the present disclosure provide a storage battery monitoring system, including: n cell monitoring cells (CMCs), a control module, and several daisy chain buses; where n is an integer greater than or equal to 2; the n CMCs are configured to monitor a plurality of cell modules electrically connected in a storage battery, and each CMC is configured to monitor at least one of the plurality of cell modules; the n CMCs are connected to the control module through each daisy chain bus; the control module is configured to receive monitoring data of the plurality of cell modules uploaded by the n CMCs through a transmission path formed by at least one daisy chain bus; and the control module is further configured to identify a fault location according to the monitoring data when a fault occurring to the transmission path is detected, and adjust the transmission path according to the fault location so as to receive the monitoring data.

Some embodiments of the present disclosure also provide a storage battery monitoring method, applied to a control module in a storage battery monitoring system. The storage battery monitoring system also includes n cell monitoring cells (CMCs) and several daisy chain buses. The n CMCs are configured to monitor a plurality of cell modules electrically connected in a storage battery, and each CMC is configured to monitor its corresponding cell modules. The n CMCs are connected to the control module through each daisy chain bus. n is an integer greater than or equal to 2. The storage battery monitoring method includes: receiving monitoring data of the plurality of cell modules uploaded by the n CMCs through a transmission path formed by at least one daisy chain bus; identifying a fault location according to the monitoring data when a fault occurring to the transmission path is detected; and adjusting the transmission path according to the fault location so as to receive the monitoring data.

Compared with the existing technology, the storage battery monitoring system includes several daisy chain buses, and n CMCs are connected to the control module through each daisy chain bus. The control module identifies the fault location according to the monitoring data when the fault occurring to the transmission path is detected, and adjusts the transmission path according to the fault location so as to receive the monitoring data. That is, when the fault occurs to the current transmission path and the monitoring data may not be received, an adjusted transmission path may be used to continue to receive the monitoring data, thus avoiding the problem of communication failure due to the occurrence of the fault in the current transmission path and improving safety.

In addition, the control module includes an adaptive controller and a microcontroller. The microcontroller receives the monitoring data uploaded by the n CMCs through the adaptive controller; and the adaptive controller is configured to identify the fault location according to the monitoring data when the fault occurring to the transmission path is detected, and adjust the transmission path according to the fault location. In this embodiment, the adaptive controller is used to adaptively adjust the transmission path, which may reduce a burden on a microprocessor.

In addition, the monitoring data includes state data of the plurality of cell modules collected by the n CMCs and a respective extremum value of each of at least one state parameter in the state data determined by the n CMCs. The adaptive controller is further configured to output an alarm signal when it is identified that the respective extremum value reaches a preset alarm threshold. In this embodiment, the respective extremum value of each of the at least one state parameter is determined by the CMC and then uploaded, so that the control module can obtain the respective extremum value without needing to process the state data after receiving the state data, which may not only reduce the processing burden of the microprocessor, but also improve the timeliness of discovering a storage battery abnormality. The respective extremum value of each of the at least one state parameter is judged by the adaptive controller, which may further reduce the running burden of the microcontroller.

In addition, there are two daisy chain buses. The monitoring data includes state data of the plurality of cell modules collected by the n CMCs and a respective extremum value of each of at least one state parameter in the state data determined by the n CMCs. The control module is configured to receive the state data through the transmission path formed by one of the two daisy chain buses, and receive the respective extremum value through the transmission path formed by another of the two daisy chain buses. In this embodiment, the transmission efficiency may be improved by separately transmitting the state data and the respective extremum value of each of the at least one state parameter of the n cell modules, so that the control module may timely judge whether there is a potential danger through the state parameter.

In addition, the fault location is any position in the transmission path formed by one of the two daisy chain buses; and an adjusted transmission path is a transmission path formed by another of the two daisy chain buses. This embodiment provides a case of the fault location and its corresponding adjusted transmission path.

In addition, there are two fault locations, which are respectively located on the transmission paths formed by the two daisy chain buses and both between a k-th CMC and a k+1-th CMC; where k is an integer and 1≤k≤n−1. There are two adjusted transmission paths, namely, a transmission path formed by a line between the control module and a first CMC, the first CMC and the k-th CMC in one of the two daisy chain buses, and a transmission path formed by a line between the k+1-th CMC and a n-th CMC, and the n-th CMC and the control module in another of the two daisy chain buses. This embodiment provides another case of the fault location and its corresponding adjusted transmission path.

In addition, there are two fault locations, which are respectively located on the transmission paths formed by the two daisy chain buses, where one of the two fault locations is between a k-th CMC and a k+1-th CMC of one of the two daisy chain buses, and another of the two fault locations is between a k+1+a CMC and a k+2+a CMC of another of the two daisy chain buses; where both k and a are integers greater than or equal to 1, a is an integer greater than or equal to 0, and k+2+a≤n; an adjusted transmission path is: a circular transmission path formed by a line between the control module and a first CMC, the first CMC and the k-th CMC, the k+1-th CMC and the k+2+a-th CMC in one of the two daisy chain buses, and between the k-th CMC and the k+1-th CMC, the k+2+a-th CMC and a n-th CMC, and the n-th CMC and the control module in another of the two daisy chain buses; or, a circular transmission path formed by a line between the control module and the first CMC, the first CMC and the k+1+a-th CMC in another of the two daisy chain buses, and between the k+1+a-th CMC and the n-th CMC and the n-th CMC the control module in the one of the two daisy chain buses; or, a transmission path formed a line between the control module and the first CMC, the first CMC and the k-th CMC, the k+1-th CMC and the n-th CMC in the one of the two daisy chain buses, and between the k-th CMC and the k+1-th CMC in another of the two daisy chain buses; or, a transmission path formed by a line between the k+2+a-th CMC and the k+1+a-th CMC in the one of the two daisy chain buses, and between the control module and the n-th CMC, the n-th CMC and the k+2+a-th CMC, and the k+1+a-th CMC and the first CMC in another of the two daisy chain buses. This embodiment provides yet another case of the fault location and its corresponding adjusted transmission path.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

DETAILED DESCRIPTION

The embodiments of the present disclosure will be described in detail below with reference to the accompanying drawings in order to make the objectives, technical solutions and advantages of the present disclosure clearer. However, it will be apparent to those skilled in the art that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments. The following embodiments are divided for convenience of description, and should not constitute any limitation to the specific implementation of the present disclosure. The various embodiments may be combined with each other and referred to each other on the premise of no contradiction.

Figure 1:
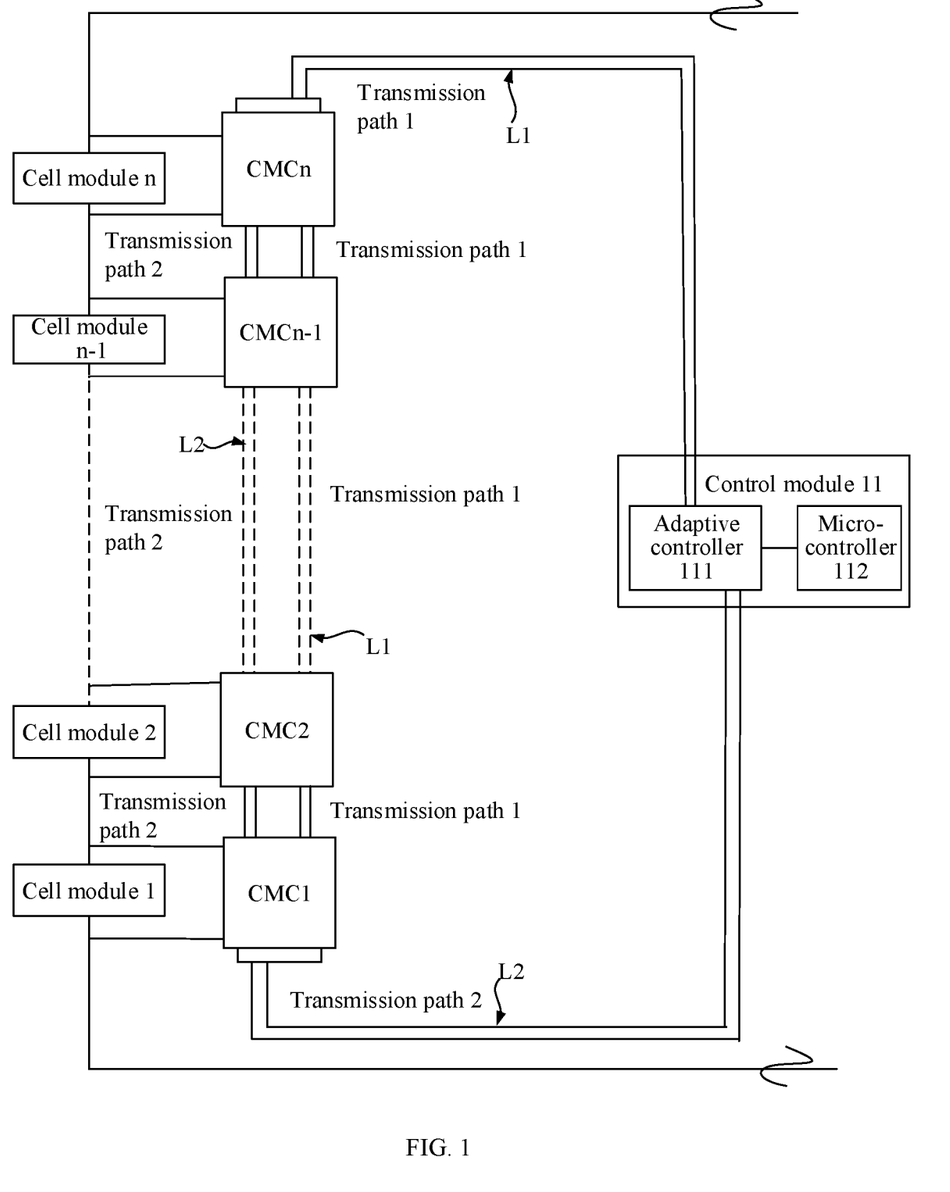
FIG. 1 is a schematic diagram of a storage battery monitoring system according to a first embodiment of the present disclosure.

A first embodiment of the present disclosure relates to a storage battery monitoring system, as shown in FIG. 1, which includes: n cell monitoring cells (CMC), a control module 11 and several daisy chain buses. Here, n is an integer greater than or equal to 2. The n CMCs are configured to monitor a plurality of cell modules electrically connected in a storage battery in a one-to-one correspondence, and each CMC is configured to monitor at least one of the plurality of cell modules; and the n CMCs are connected to the control module 11 through each daisy chain bus.

The control module 11 is configured to receive monitoring data of the plurality of cell modules uploaded by the n CMCs through a transmission path formed by at least one daisy chain bus; and the control module 11 is further configured to identify a fault location according to the monitoring data when a fault occurring to the transmission path is detected, and adjust the transmission path according to the fault location so as to receive the monitoring data.

In the embodiment of the present disclosure, the storage battery monitoring system includes several daisy chain buses, and the n CMCs are connected to the control module through each daisy chain bus. The control module identifies the fault location according to the monitoring data when the fault occurring to the transmission path is detected, and adjusts the transmission path according to the fault location so as to receive the monitoring data. That is, when the fault occurs to the current transmission path and the monitoring data may not be received, an adjusted transmission path may be used to continue to receive the monitoring data, thus avoiding the problem of communication failure due to the occurrence of the fault in the current transmission path and improving safety.

The implementation details of the storage battery monitoring system in this embodiment are described in detail below. The following contents are only implementation details provided for ease of understanding and are not necessary for implementing the present solution.

The storage battery monitoring system in this embodiment is used to monitor a storage battery in an electric vehicle to ensure driving safety. However, it is not limited to this, and the storage battery monitoring system in this embodiment may also be applied to the monitoring of a storage battery in other electrical equipment.

In this embodiment, as shown in FIG. 1, the storage battery includes n cell modules, which are a cell module 1, a cell module 2, . . . , a cell module n. Then cell modules are sequentially connected in series, and each cell module includes a plurality of cells connected each other. In this embodiment, the voltages of the cell module 1, the cell module 2, . . . , the cell module n increase sequentially, that is, the cell module 1 is a cell module with a lowest potential in the storage battery, and the cell module n is a cell module with a highest potential in the storage battery. However, it is not limited to this. In other examples, the voltages of the cell module 1, the cell module 2, . . . , the cell module n may decrease sequentially. Then CMCs are a CMC1, a CMC2, . . . , a CMCn, and then CMCs correspond to the n cell modules one by one. That is, a CMCk is connected to both ends of a cell module k to monitor it. Here, k is an integer and 1≤k≤n. Since the CMC1 corresponds to the cell module 1 and the CMCn corresponds to the cell module n, then the CMC1 is a CMC with the lowest potential among the n CMCs, and the CMCn is a CMC with the highest potential among the n CMCs.

It should be noted that the number of the CMCs in this embodiment is the same as the number of the cell modules, that is, the n CMCs correspond to the n cell modules one by one. However, it is not limited to this, and the number of the CMCs and the cell modules is not limited. If a CMC has relatively more sampling channels, it may also monitor a plurality of cell modules. For example, if a CMC has 12 sampling channels and each cell module includes 4 cells, then the CMC may monitor 3 cell modules. Alternatively, the same cell module may also be monitored by a plurality of CMCs.

As shown in FIG. 1, there are two daisy chain buses, namely, a daisy chain bus L1 and a daisy chain bus L2. The n CMCs are connected to the control module 11 through each daisy chain bus, and a transmission path may be formed based on each daisy chain bus. In this embodiment, the daisy chain bus may transmit a signal in a differential manner. The daisy chain buses L1 and L2 in the figure respectively have two transmission lines, which may be understood as a pair of differential transmission lines.

The CMC1, the CMC2, . . . , and the CMCn are respectively connected to the daisy chain bus L1 and connected to the control module 11 through the daisy chain bus L1, and the CMCn is directly connected to the control module 11. That is, a transmission path 1 formed based on the daisy chain bus L1 includes the n CMCs, a line between adjacent CMCs, and a line between the CMCn and control module 11; and a transmission direction of the monitoring data is from CMC1, CMC2, . . . , CMCn, to the control module 11, that is, transmitting from the low potential to the high potential.

The CMC1, the CMC2, . . . , and the CMCn are respectively connected to the daisy chain bus L2 and connected to the control module 11 through the daisy chain bus L2, and the CMC1 is directly connected to the control module 11. That is, a transmission path 2 formed based on the daisy chain bus L2 includes the n CMCs, a line between adjacent CMCs, and a line between the CMC1 and control module 11; and the transmission direction of the monitoring data is from CMCn, CMCn−1, . . . , CMC1, to the control module 11, that is, transmitting from the high potential to the low potential.

In this embodiment, the monitoring data of the n cell modules includes state data of the plurality of cell modules and a respective extremum value of each of at least one state parameter in the state data. Herein, the state data of the plurality of cell modules are respectively collected by the n CMCS, and the state data includes a plurality of state parameters such as voltage, current and temperature of each cell in each cell module. Each CMC may also determine the respective extremum value through a step-by-step comparison and upload the respective extremum value to the control module 11. Generally, a state parameter closely related to the safety performance of the storage battery may be selected and its extremum value may be determined, such as a maximum value of the voltage and a maximum value of the temperature. In this embodiment, the respective extremum value of each of the at least one state parameter is determined by the CMC and then uploaded, so that the control module 11 can obtain the respective extremum value without needing to process the state data after receiving the state data, which may not only reduce the processing burden of a microprocessor, but also improve the timeliness of discovering a storage battery abnormality.

In this embodiment, the transmission path 1 formed based on the daisy chain bus L1 and the transmission path 2 formed based on the daisy chain bus L2 may both transmit data in two directions, that is, one direction is used to upload the monitoring data of the n cell modules, and another direction is used to issue a control command of the control module to each CMC. In this embodiment, the transmission directions of the monitoring data of the n cell modules uploaded by the two daisy chain buses may be opposite. However, it is not limited to this. In other examples, the transmission directions of the monitoring data of the n cell modules uploaded by the two daisy chain buses may be the same. Herein, this embodiment and the following embodiments are illustrated by taking the two daisy chain buses L1, L2 and transmission directions of the two transmission paths respectively formed based on the daisy chain buses L1, L2 being opposite as an example, but are not limited thereto.

In this embodiment, the control module 11 receives the state data of the n cell modules through the transmission path formed based on one of the two daisy chain buses, and receives a maximum voltage value and a maximum temperature value through the transmission path formed based on another of the two daisy chain buses. For example, the control module 11 receives the state data of the n cell modules through the transmission path 1 formed based on the daisy chain bus L1, and receives the extremum values of the state parameters through the transmission path 2 formed based on the daisy chain bus L2. Herein, each CMC determines the extremum values of the state parameters through the step-by-step comparison. Specifically, the CMCn transmits a collected voltage value and temperature value of the cell module n to the CMCn-1. The CMCn-1 compares a collected voltage value and temperature value of the cell module n-1 with the received voltage value and temperature value of cell module n respectively, to obtain a relatively large voltage value and a relatively large temperature value, and transmits the relatively large voltage value and the relatively large temperature value to a CMCn-2. The CMCn-2 compares a collected voltage value and temperature value of a cell module n-2 with the relatively large voltage value and the relatively large temperature value received from the CMCn-1 respectively, to obtain a re-determined relatively large voltage value and relatively large temperature value, and transmits the re-determined relatively large voltage value and relatively large temperature value to a CMCn-3; and so on, until the CMC1 obtains the maximum voltage value and the maximum temperature value, and uploads the maximum voltage value and the maximum temperature value to the control module 11.

In this embodiment, the state data of the n cell modules and the extremum values of the state parameters are uploaded through the transmission path 1 and the transmission path 2 respectively, which may improve the transmission efficiency of the monitoring data. However, it is not limited to this. In other examples, the state data and the extremum values of the state parameters may also be uploaded to the control module 11 through the same transmission path. For example, the state data and the extremum values of the state parameters are both uploaded through the transmission path 1 or are both uploaded through the transmission path 2.

It should be noted that the control module 11 may also issue a control command to the n CMCs so as to control each CMC to control its corresponding cell module. The control command may be issued to each CMC through the same transmission path. For example, the control command may be issued to each CMC through the transmission path 1 or the transmission path 2.

As shown in FIG. 1, the control module 11 in this embodiment includes an adaptive controller 111 and a microcontroller 112. The adaptive controller 111 has two connection ports, one of which is connected with the daisy chain bus L1, and another is connected with the daisy chain bus L2. The adaptive controller 111 is configured to identify a fault location according to the monitoring data when a fault occurring to the transmission path 1 or the transmission path 2 is detected, and adjust the transmission path according to the fault location. The microcontroller 112 is connected to the adaptive controller 111 and communicates with the n CMCs through the adaptive controller 111, that is, the microcontroller 112 receives the monitoring data uploaded by the n CMCs or issues the control command to the n CMCs through the adaptive controller 111. Herein, the communication between the adaptive controller 111 and each CMC, and between the adaptive controller 111 and the microcontroller 112 may use a standard communication protocol such as SPI, CAN, UART, etc., or a non-standard communication protocol (i.e., a protocol defined by a developer's own coding).

However, it is not limited to this. In other examples, the control module 11 may only include the microcontroller 112. At this time, the microcontroller 112 includes two connection ports, one of which is connected with the daisy chain bus L1 and another is connected with the daisy chain bus L2, and performs all functions of the control module 11.

In this embodiment, in a normal state, the state data of the n cell modules are transmitted through the transmission path 1 formed based on the daisy chain bus L1, and the maximum voltage value and the maximum temperature value of the cells are transmitted through the transmission path 2 formed based on the daisy chain bus L2. The adaptive controller 111 may upload the monitoring data received from the n CMCs to the microcontroller 112, so that the microcontroller 112 analyzes and processes the monitoring data.

The adaptive controller 111 may detect whether a fault occurs to the transmission path. For example, the adaptive controller 111 may preset a waiting time for each data reception. After receiving data once, if the next data is received after the waiting time, whether a fault occurs to the transmission path is determined. In addition, the adaptive controller 111 may identify a fault location according to the monitoring data when the fault occurring to the transmission path is detected, and adjust the transmission path according to the fault location to receive the monitoring data.

Herein, the adaptive controller 111 may identify the fault location according to whether the monitoring data may be received normally by controlling a CMC communication port to loop back one by one and issuing a test instruction. The transmission path 2 in FIG. 1 is taken as an example:

The adaptive controller 111 sets a communication port of the CMC1 to a loop-back mode and issues a sampling control instruction. If the adaptive controller 111 may normally receive the state data of the cell module 1 collected by the CMC1 within a specified time, it indicates that the daisy chain transmission path between the adaptive controller 111 and the CMC1 has no fault; otherwise, it indicates that there is a fault.

When there is no fault in the daisy chain of the CMC1 area, the adaptive controller 111 changes the loop-back mode of the communication port of the CMC1 to a normal mode, and sets the communication port of the CMC2 to the loop-back mode. At the same time, the adaptive controller 111 issues the sampling control instruction. If the state data of the cell module 1 and the cell module 2 collected by the CMC1 and the CMC2 may be normally received within the specified time after the sampling control instruction is issued, it indicates that the daisy chain between the adaptive controller 111 and the CMC2 has no fault; otherwise, it indicates that there is a fault. By analogy, the fault location of the CMC daisy chain is judged one by one in the same way as the above-mentioned daisy chain fault location judgment.

In this embodiment, there are three cases for the fault location, which are specifically as follows.

In the first case, the fault location is any position in the transmission path formed by one of the two daisy chain buses. At this time, an adjusted transmission path is a transmission path formed by another of the two daisy chain buses.

Figure 2:
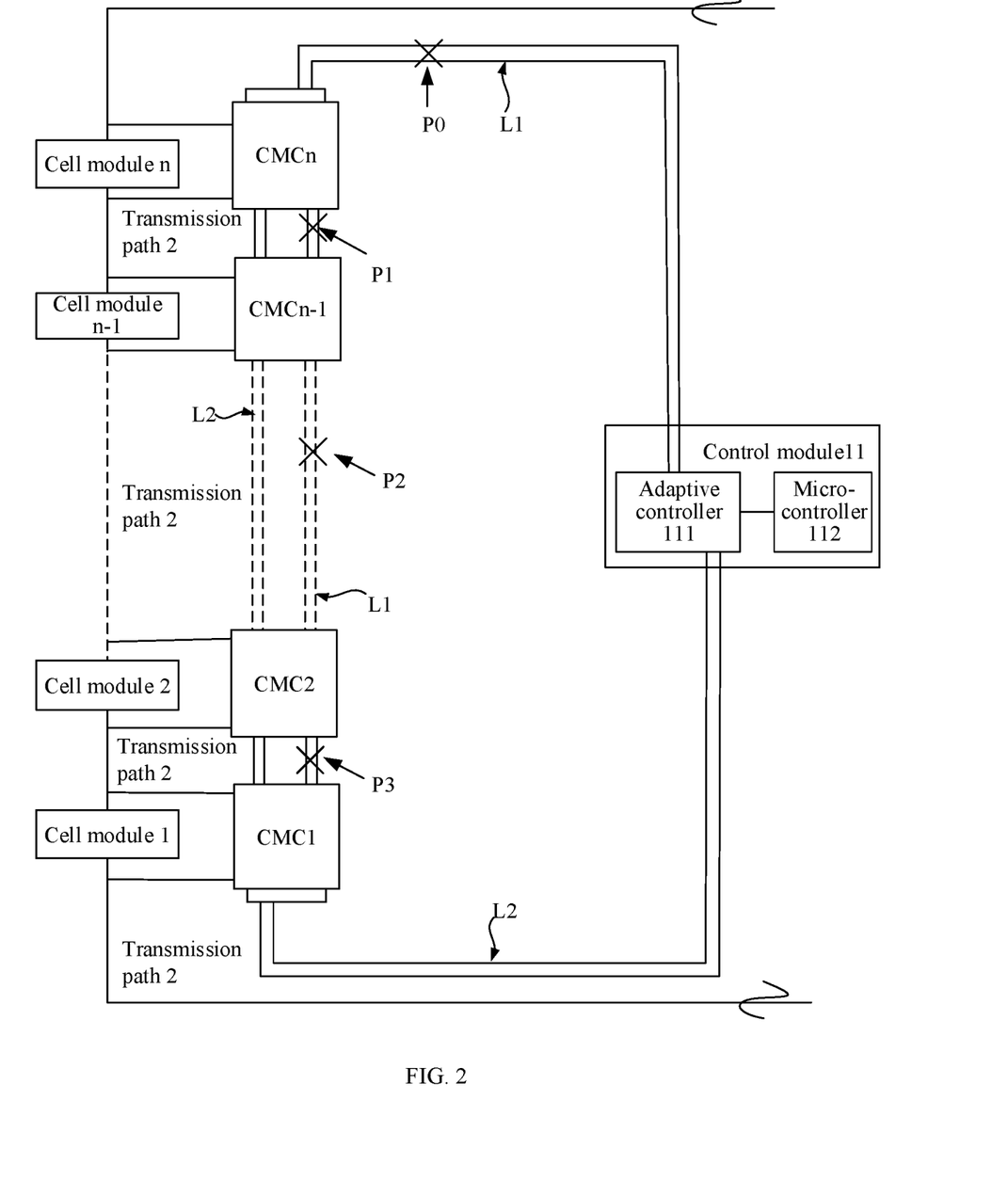
FIG. 2 is a schematic diagram of an example of a fault location according to the first embodiment of the present disclosure.

As shown in FIG. 2, positions P0, P1, P2 and P3 are schematically shown on the daisy chain bus L1, where the position P2 refers to any position between the CMC2 and the CMCn-1, that is, it is schematically shown in FIG. 2 that a fault occurs to the transmission path 1. It should be noted that the fault at any position in the transmission path here may be a fault in a line between adjacent CMCs or a line between the CMCn and the control module 11, or a fault in any CMC device itself.

In the first case, the adaptive controller 111 issues the control command to the n CMCs to control the n CMCs to transmit the monitoring data (including the state data of the n cell modules and the extremum values of the state parameters) through the daisy chain bus L2, that is, the adjusted transmission path is the transmission path 2 formed based on the daisy chain bus L2. That is, when the fault occurs to the transmission path 1, the state data of the n cell modules originally transmitted through the transmission path 1 formed based on the daisy chain bus L1 is changed to be transmitted through the transmission path 2 formed based on the daisy chain bus L2. It should be noted that FIG. 2 only illustrates the case where the fault occurs to the transmission path 1. If the fault occurs to the transmission path 2, the adjusted transmission path is the transmission path 1 formed based on the daisy chain bus L1.

In the second case, there are two fault locations, which are respectively located on the transmission paths formed by the two daisy chain buses and both between a k-th CMC and a k+1-th CMC, where k is an integer and 1≤k≤n−1. At this time, there are two adjusted transmission paths, namely, a transmission path formed by a line between the control module 11 and a first CMC, the first CMC and the k-th CMC in one of the two daisy chain buses, and a transmission path formed by a line between the k+1-th CMC and a n-th CMC, and the n-th CMC and the control module in another of the two daisy chain buses.

Figure 3:
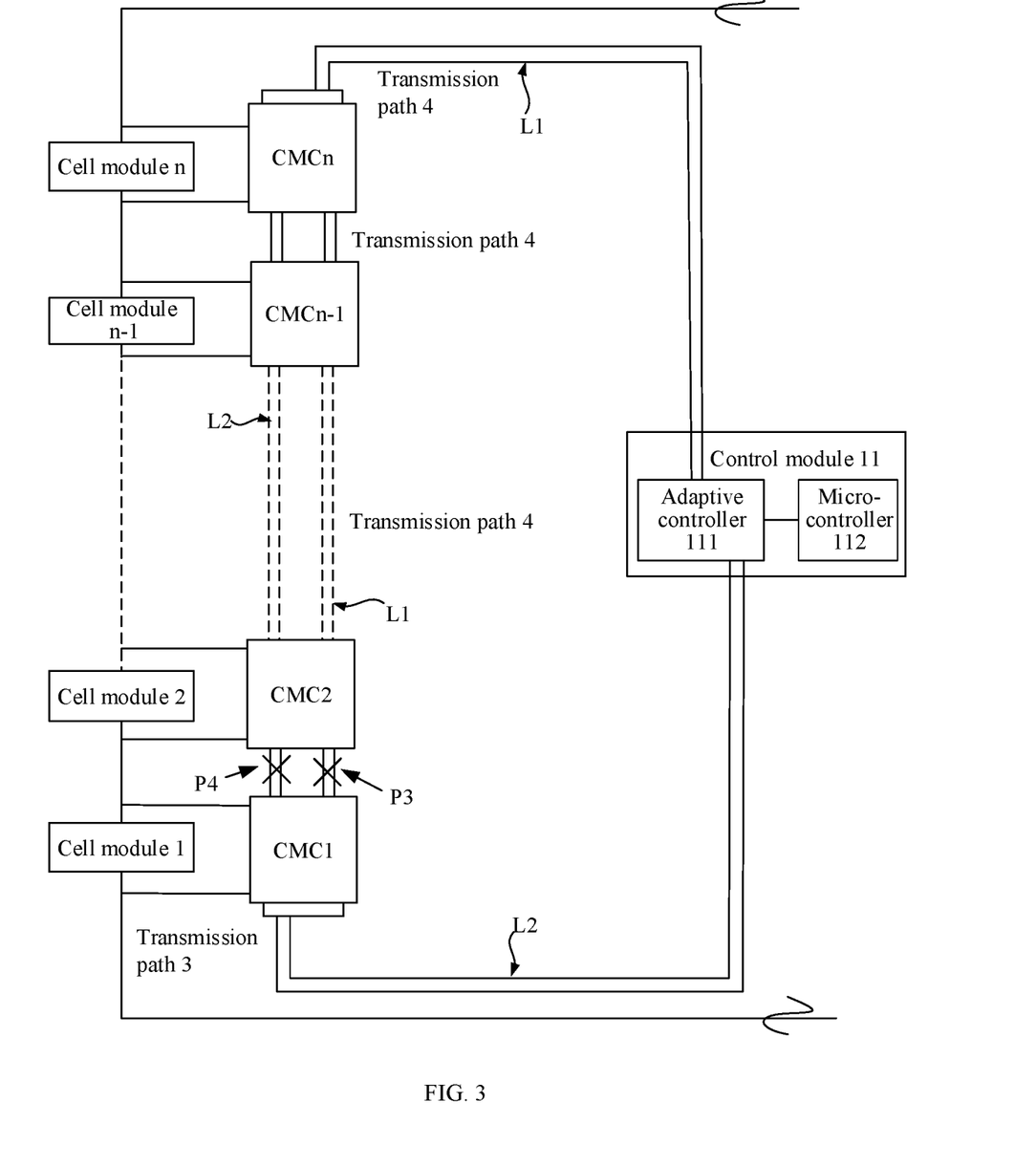
FIG. 3 is a schematic diagram of another example of a fault location according to the first embodiment of the present disclosure.

FIG. 3 shows positions P3 and P4, where the position P3 is located on the transmission path 1 formed by the daisy chain bus L1, the position P4 is located on the transmission path 2 formed by the daisy chain bus L2, and both the position P3 and the position P4 are located between the CMC1 and the CMC2. When the fault occurs to the position P3 and the position P4 simultaneously, it indicates that both the transmission path 1 and the transmission path 2 have problems. At this time, there are two adjusted transmission paths, namely, a transmission path 3 formed by a line between the CMC1 and the control module 11 in the daisy chain bus L2 and a transmission path 4 formed by a line between the CMC2 and the CMCn and a line between the CMCn and the control module 11 in daisy chain bus L1. That is, the adaptive controller 111 receives the monitoring data uploaded by the CMC1 through the transmission path 3, and receives monitoring data uploaded by the CMC2 to the CMCn through the transmission path 4, and transmits the received monitoring data from the CMC1, the CMC2 to the CMCn to the microcontroller 112. The monitoring data from the CMC1, the CMC2 to the CMCn are uploaded in two paths, so the extremum values of the state parameters may not be obtained by each CMC through the step-by-step comparison, that is, the microcontroller 112 may obtain the extremum values of the state parameters only by identifying and comparing the received monitoring data from the CMC1, the CMC2 to the CMCn. Herein, the microcontroller 112 issues the control command to the CMC1 through the transmission path 3, and issues the control command to the CMC2 to the CMCn through the transmission path 4. It should be noted that FIG. 3 only illustrates the case where the fault location is between the CMC1 and the CMC2; however, it is not limited to this. When the fault occurs to the transmission path 1 and the transmission path 2 between any two adjacent CMCs simultaneously, the adjusted transmission path may be obtained by the above-described methods.

In the third case, there are two fault locations, which are respectively located on the transmission paths formed by the two daisy chain buses, where one of the fault locations is between the k-th CMC and the k+1-th CMC, and another fault location is between a k+1+a CMC and a k+2+a CMC; where a is an integer greater than or equal to 0, and k+2+a≤n. The adjusted transmission path is: a circular transmission path formed between the control module 11 and the first CMC, the first CMC and the k-th CMC, the k+1-th CMC and the k+2+a-th CMC in one of the two daisy chain buses, and between the k+2+a-th CMC and the n-th CMC, and the control module in another of the two daisy chain buses.

Figure 4:
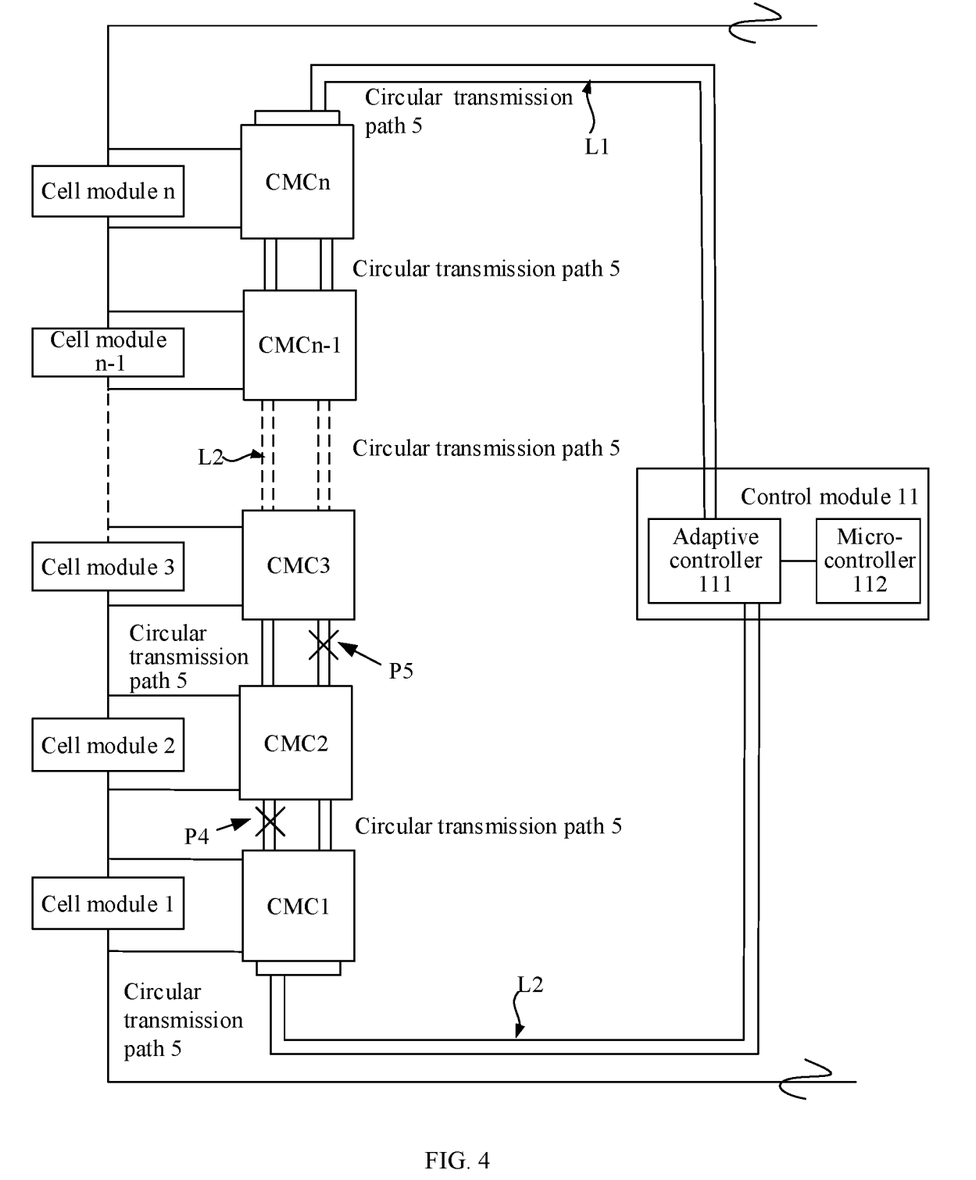
FIG. 4 is a schematic diagram of yet another example of a fault location according to the first embodiment of the present disclosure.

FIG. 4 shows a position P4 and a position P5. The position P4 is on the daisy chain bus L2 and between the CMC1 and the CMC2, and the position P5 is on the daisy chain bus L1 between the CMC2 and the CMC3. That is, in the example of FIG. 4, the value of k is 1 and the value of a is 0. When the fault occurs to the position P4 and the position P5 simultaneously, it indicates that both the daisy chain buses L1 and L2 have problems. At this time, the transmission path needs to be re-adjusted so that the monitoring data may be transmitted to the microcontroller 112. An adjustment basis is that due to the fault at the position P4, when transmitting between the CMC1 and the CMC2, it is necessary to transfer the monitoring data from a line between the CMC1 and the CMC2 in the daisy chain bus L2 to a line between the CMC1 and the CMC2 in the daisy chain bus L1 for transmission; and due to the fault at the position P5, when transmitting between the CMC2 and the CMC3, it is necessary to transfer the monitoring data from a line between the CMC2 and the CMC3 in the daisy chain bus L1 to a line between the CMC2 and the CMC3 in the daisy chain bus L2 for transmission. According to the above adjustment basis, three different transmission paths may be obtained after adjustment, which are specifically as follows.

A first transmission path is a circular transmission path 5 formed by lines between the control module 11 and the CMC1, the CMC2 and the CMC3 in the daisy chain bus L2, and lines between the CMC1 and the CMC2, the CMC3 and the CMCn, and the CMCn and the control module 11 in the daisy chain bus L1.

A second transmission path is a single daisy chain transmission path formed by lines between the control module 11 and the CMC1, the CMC2 and the CMCn in the daisy chain bus L2, and the line between the CMC1 and the CMC2 in the daisy chain bus L1.

A third transmission path is a single daisy chain transmission path formed by lines between the control module 11 and the CMCn, the CMCn−1 and the CMC3, and the CMC2 and the CMC1 in the daisy chain bus L1, and the line between the CMC3 and the CMC2 in the daisy chain bus L2.

In addition, if the position P4 is on the daisy chain bus L1 and between the CMC1 and the CMC2, and the position P5 is on the daisy chain bus L2 and between the CMC2 and the CMC3, then the following transmission path may be formed.

A fourth transmission path is a circular transmission path formed by lines between the control module 11 and the CMC1, the CMC1 and the CMC2 in the daisy chain bus L2, and lines between the CMC2 and the CMCn, and the CMCn and the control module 11 in the daisy chain bus L1.

The adaptive controller 111 may obtain any adjusted transmission path by reconfiguring each CMC; receive the monitoring data uploaded by the n CMCs through the adjusted transmission path, and transmit the monitoring data to the microcontroller 112; where the extremum values of the state parameters may be obtained by a successive comparison of each CMC. The microcontroller 112 may also issue the control command to each CMC through the adjusted transmission path.

Herein, there may be two ways to adjust the transmission path, namely a hardware trigger mode and a software control mode. In the hardware trigger mode, after detecting the fault location for the first time, the adaptive controller 111 triggers a communication path switching function of a daisy chain control unit within the corresponding CMC, so that the transmission path may be automatically switched after the communication path switching function of the CMC is triggered. Then, the adaptive controller 111 may re-detect whether the adjusted transmission path is normal according to the above-described identification of the fault location. In the software control mode, after detecting the fault location, the adaptive controller 111 directly sends a control command to control the corresponding CMC to switch the transmission path.

It should be noted that, in other examples, if the number of the daisy chain buses is greater than two, then transmission paths formed by any two of the daisy chain buses may be selected to respectively transmit the monitoring data of the n cell modules and the respective extremum value of each of the at least one state parameter, and the rest of the daisy chain buses are used as a standby daisy chain bus. When the fault of the above three cases occurs, the transmission path may be adjusted according to the above method of this embodiment; or, a transmission path formed by the standby daisy chain bus may be used to transmit the monitoring data.

A second embodiment of the present disclosure relates to a storage battery monitoring system. The second embodiment is substantially the same as the first embodiment, with the main difference that in the second embodiment of present disclosure, the adaptive controller 111 is further configured to output an alarm signal when it is identified that a respective extremum value of each of at least one state parameter reaches a preset alarm threshold.

The adaptive controller 111 is internally preset with the alarm threshold corresponding to the state parameter. In this embodiment, the alarm threshold includes a voltage alarm threshold and a temperature alarm threshold. When the adaptive controller 111 receives a maximum voltage value and a maximum temperature value of a cell, it outputs an alarm signal if it is identified that the maximum voltage value reaches the voltage alarm threshold and/or the maximum temperature value reaches the temperature alarm threshold. That is, as long as one parameter of the maximum voltage value and the maximum temperature value reaches its corresponding alarm threshold, it indicates that the storage battery is in a dangerous state, and the alarm signal is output. In this embodiment, the adaptive controller is configured to perform judgement on the respective extremum value, which may further reduce the operating burden of the microcontroller.

Figure 5:
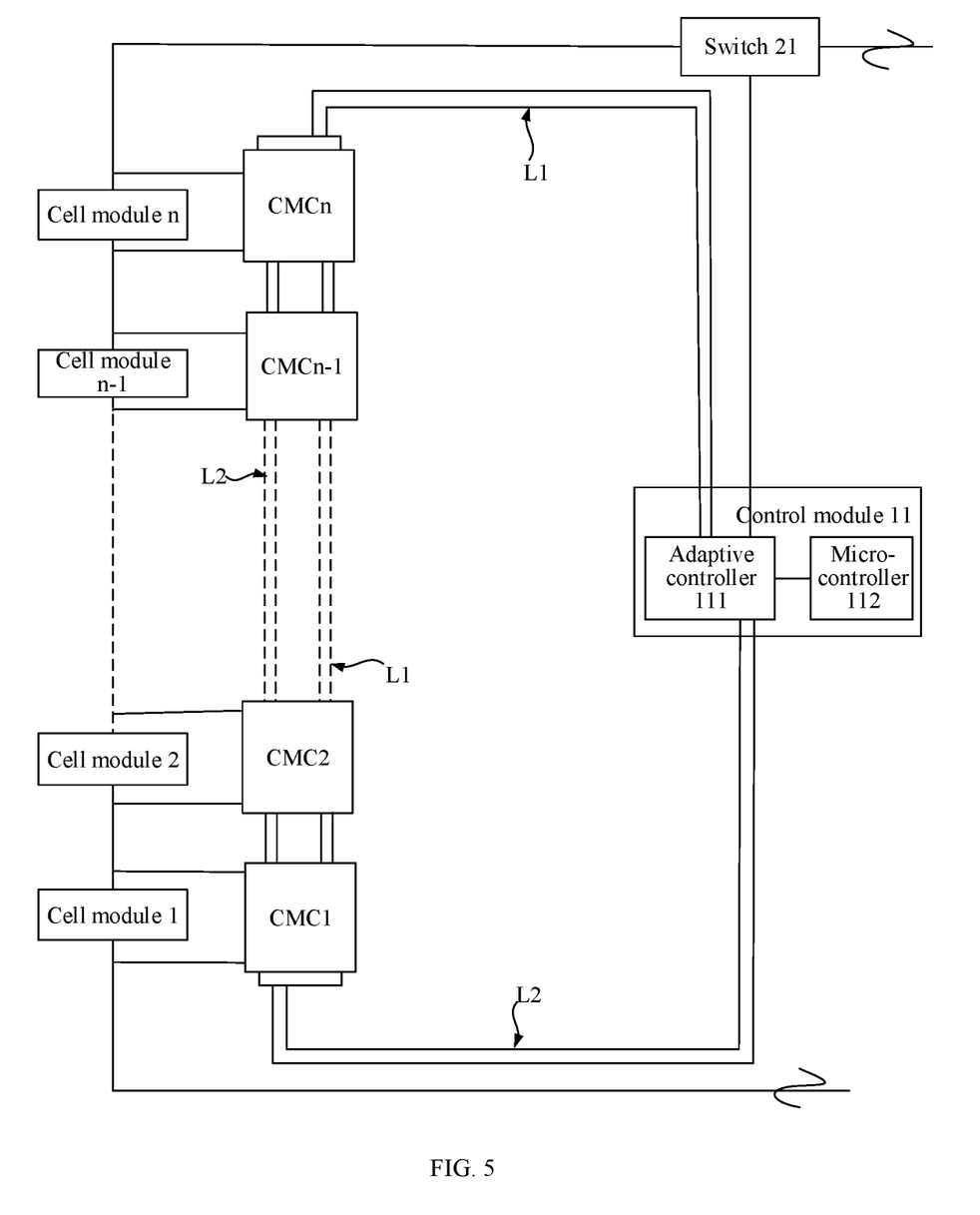
FIG. 5 is a schematic diagram of a storage battery monitoring system according to a second embodiment of the present disclosure.

In an example, as shown in FIG. 5, the adaptive controller 111 is also connected to a switch 21 in a battery circuit where the storage battery is located; and the alarm signal is a signal for controlling the switch 21 to be turned off. That is, the adaptive controller 111 outputs the alarm signal to the switch 21 to turn off the switch 21, thereby turning off the battery circuit.

In this embodiment, the switch 21 shown in FIG. 5 is connected to the cell module n, that is, set on a high-voltage side of the storage battery, but it is not limited to this. In other examples, the switch may also be set on a low-voltage side of the storage battery, or there may be two switches respectively set on the high-voltage side and the low-voltage side of the storage battery. The adaptive controller 111 is connected to the two switches at the same time, and may output the alarm signal to the two switches at the same time.

It is worth mentioning that all modules involved in this embodiment are logic modules. In practical applications, a logic unit may be a physical unit, or a part of a physical unit, or a combination of multiple physical units. In addition, in order to highlight the innovative part of the present disclosure, a unit that is not closely related to solving the technical problems proposed in present disclosure is not introduced in this embodiment, but this does not indicate that there are no other units in this embodiment.

A third embodiment of the present disclosure relates to a storage battery monitoring method, which is applied to a control module in a storage battery monitoring system. Referring to FIG. 1, the storage battery monitoring system includes: n cell monitoring cells (CMC), a control module 11 and several daisy chain buses, where n is an integer greater than or equal to 2. The n CMCs are configured to monitor the n cell modules electrically connected in a storage battery in one-to-one correspondence, and each CMC is configured to monitor at least one cell module; and the n CMCs are connected to the control module 11 through each daisy chain bus.

Figure 6:
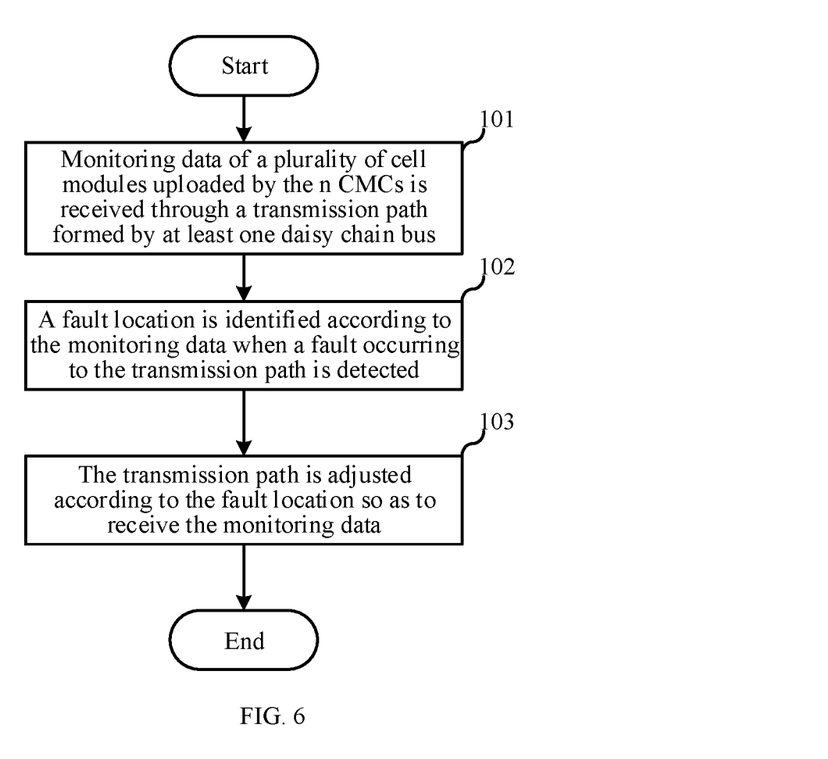
FIG. 6 is a flowchart of a storage battery monitoring method according to a third embodiment of the present disclosure.

FIG. 6 shows a flowchart of the storage battery monitoring method of this embodiment, including:

In step 101, monitoring data of a plurality of cell modules uploaded by the n CMCs is received through a transmission path formed by at least one daisy chain bus.

In step 102, a fault location is identified according to the monitoring data when a fault occurring to the transmission path is detected.

In step 103, the transmission path is adjusted according to the fault location so as to receive the monitoring data.

In the embodiment of the present disclosure, the storage battery monitoring system includes several daisy chain buses, and n CMCs are connected to the control module through each daisy chain bus. The control module identifies the fault location according to the monitoring data when the fault occurring to the transmission path is detected, and adjusts the transmission path according to the fault location so as to receive the monitoring data. That is, when the fault occurs to the current transmission path and the monitoring data may not be received, an adjusted transmission path may be used to continue to receive the monitoring data, thus avoiding the problem of communication failure due to the occurrence of the fault in the current transmission path and improving safety.

It is not difficult to find that this embodiment is a method embodiment corresponding to the first embodiment, and this embodiment may be implemented in cooperation with the first embodiment. The relevant technical details mentioned in the first embodiment are still valid in this embodiment, and in order to reduce repetition, they will not be repeated here. Correspondingly, the relevant technical details mentioned in this embodiment may also be applied in the first embodiment.

A fourth embodiment of the present disclosure relates to a storage battery monitoring method. The fourth embodiment is substantially the same as the third embodiment, with the main difference that in the fourth embodiment of present disclosure, the adaptive controller may pre-alarm according to a respective extremum value of each of at least one state parameter.

Figure 7:
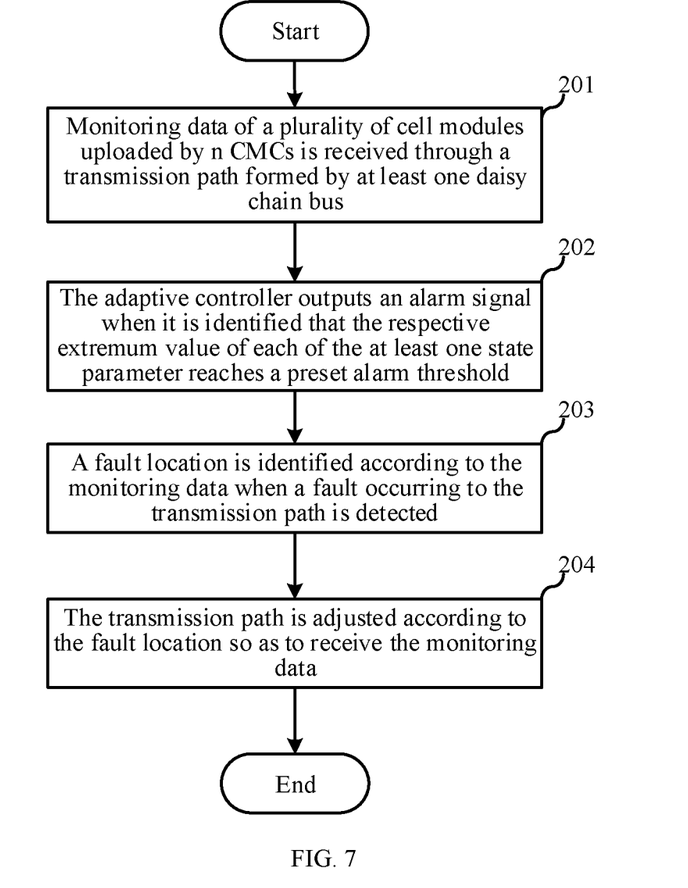
FIG. 7 is a flowchart of a storage battery monitoring method according to a fourth embodiment of the present disclosure.

Referring to FIG. 1 and FIG. 7 together, where FIG. 7 is a schematic diagram of the storage battery monitoring method according to the fourth embodiment of the present disclosure, including:

In step 201, monitoring data of a plurality of cell modules uploaded by n CMCs is received through a transmission path formed by at least one daisy chain bus.

In step 202, the adaptive controller outputs an alarm signal when it is identified that the respective extremum value reaches a preset alarm threshold.

In step 203, a fault location is identified according to the monitoring data when a fault occurring to the transmission path is detected.

In step 204, the transmission path is adjusted according to the fault location so as to receive the monitoring data.

Herein, the step 201, the step 203, the step 204 are substantially the same as the step 101-the step 103, which will not be repeated here. The difference lies in that this embodiment also includes step 202. It should be noted that the execution sequence of step 202 and step 203 is not limited.

Specifically, the adaptive controller 111 is internally preset with the alarm threshold. In this embodiment, the alarm threshold includes a voltage alarm threshold and a temperature alarm threshold. In step 202, when the adaptive controller 111 receives a maximum voltage value and a maximum temperature value of a cell, it outputs an alarm signal if it is identified that the maximum voltage value reaches the voltage alarm threshold and/or the maximum temperature value reaches the temperature alarm threshold. That is, as long as one parameter of the maximum voltage value and the maximum temperature value reaches its corresponding alarm threshold, it indicates that the storage battery is in a dangerous state, and the alarm signal is output. In this embodiment, the adaptive controller performs judgement on the respective extremum value, which may further reduce the operating burden of the microcontroller.

In a preferred example, referring to FIG. 5, the adaptive controller 111 is also connected to a switch 21 in a battery circuit where the storage battery is located; and the alarm signal is a signal for controlling the switch 21 to be turned off. That is, the adaptive controller 111 outputs the alarm signal to the switch 21 to turn off the switch 21, thereby turning off the battery circuit.

Since the second embodiment corresponds to this embodiment, this embodiment may be implemented in cooperation with the second embodiment. The relevant technical details mentioned in the second embodiment are still valid in this embodiment, and the technical effects that may be achieved in the second embodiment may also be achieved in this embodiment. In order to reduce repetition, details are not repeated here. Correspondingly, the relevant technical details mentioned in this embodiment may also be applied in the second embodiment.

The steps set in the above-described methods only aim to make the description clearer. In implementation, the steps may be combined into one or one step may be divided into multiple steps, which all fall into the protection scope of the present disclosure as long as the same logical relationship is included. Such a trivial amendment or design added to an algorithm or procedure as not changing the algorithm or a core design of the procedure falls into the protection scope of the disclosure.

That is, those skilled in the art may understand that all or some of the steps of the method in the above-described embodiments may be completed by a program instructing related hardware, and the program may be stored in a storage medium and includes several instructions to make a device (which may be a single-chip microcomputer, a chip, etc.) or a processor implement all or some of the steps of the method described in each embodiment of present disclosure. The aforementioned storage medium includes: a U disk, a mobile hard disk, a Read-Only Memory (ROM), a Random Access Memory (RAM), a magnetic disk or an optical disk and other media that may store a program code.

Those skilled in the art should appreciate that the aforementioned embodiments are specific embodiments for implementing the present disclosure. In practice, however, various changes may be made in the forms and details of the specific embodiments without departing from the spirit and scope of the present disclosure.

What is claimed is:

1. A storage battery monitoring system, comprising: n cell monitoring cells (CMCs), a control module, and at least two daisy chain buses; wherein n is an integer greater than or equal to 2;
   the n CMCs are configured to monitor a plurality of cell modules electrically connected in a storage battery, and each CMC is configured to monitor at least one of the plurality of cell modules; the n CMCs are connected to the control module through each of the at least two daisy chain buses;
   the control module is configured to receive monitoring data of the plurality of cell modules uploaded by the n CMCs through a transmission path formed by at least one of the at least two daisy chain buses;
   the control module is further configured to identify a fault location according to the monitoring data when a fault occurring to the transmission path is detected, and adjust the transmission path according to the fault location so as to receive the monitoring data;
   the at least two daisy chain buses comprise a first daisy chain bus and a second daisy chain bus;
   the fault location comprises a first fault location between a k-th CMC and a k+1-th CMC of the first daisy chain bus, and a second fault location between a k+1+a-th CMC and a k+2+a-th CMC of the second daisy chain bus, k being an integer greater than or equal to 1, a being an integer greater than or equal to 0, and k+2+a≤n; and
   the control module is further configured to adjust the transmission path based on an adjustment basis to obtain an adjusted transmission path, the adjustment basis comprising:
   switching transmission of the monitoring data from a line between the k-th CMC and the k+1-th CMC of the first daisy chain bus to a line between a k-th CMC and a k+1-th CMC of the second daisy chain bus; and
   switching transmission of the monitoring data from a line between the k+1+a-th CMC and the k+2+a-th CMC of the second daisy chain bus to a line between a k+1+a-th CMC and a k+2+a-th CMC of the first daisy chain bus.

2. The storage battery monitoring system according to claim 1, wherein the control module comprises an adaptive controller and a microcontroller;
   the microcontroller is configured to receive the monitoring data uploaded by the n CMCs through the adaptive controller; and
   the adaptive controller is configured to identify the fault location according to the monitoring data when the fault occurring to the transmission path is detected, and adjust the transmission path according to the fault location.

3. The storage battery monitoring system according to claim 2, wherein the monitoring data comprises state data of the plurality of cell modules collected by the n CMCs and a respective extremum value of each of at least one state parameter in the state data determined by the n CMCs; and
   the adaptive controller is further configured to output an alarm signal when it is identified that the respective extremum value reaches a preset alarm threshold.

4. The storage battery monitoring system according to claim 3, wherein the adaptive controller is further connected to a switch in a battery circuit where the storage battery is located; and the alarm signal is a signal for controlling the switch to be turned off, so as to turn off the battery circuit.

5. The storage battery monitoring system according to claim 1, wherein in a transmission path formed by one of the first daisy chain bus and the second daisy chain bus, a CMC with a highest potential among the n CMCS is directly connected to the control module; in a transmission path formed by another one of the first daisy chain bus and the second daisy chain bus, a CMC with a lowest potential among the n CMCs is directly connected to the control module;
wherein, the CMC with the highest potential is a CMC for monitoring a cell module with the highest potential, and the CMC with the lowest potential is a CMC for monitoring a cell module with the lowest potential.

6. The storage battery monitoring system according to claim 1, wherein the monitoring data comprises state data of the plurality of cell modules collected by the n CMCs and a respective extremum value of each of at least one state parameter in the state data determined by the n CMCs; and
the control module is configured to receive the state data of the plurality of cell modules through the transmission path formed by one of the first daisy chain bus and the second daisy chain bus, and receive the respective extremum value through the transmission path formed by another one of the first daisy chain bus and the second daisy chain bus.

7. The storage battery monitoring system according to claim 1, wherein an adjusted transmission path is:
a circular transmission path formed by a line between the control module and a first CMC, the first CMC and the k-th CMC, the k+1-th CMC and the k+2+a-th CMC in the first daisy chain bus, and between the k-th CMC and the k+1-th CMC, the k+2+a-th CMC and a n-th CMC, and the n-th CMC and the control module in the second daisy chain bus; or,
a circular transmission path formed by a line between the control module and the first CMC and the first CMC and the k+1+a-th CMC in the second daisy chain bus, and between the k+1+a-th CMC and the n-th CMC and the n-th CMC the control module in the first daisy chain bus; or,
a transmission path formed a line between the control module and the first CMC, the first CMC and the k-th CMC, the k+1-th CMC and the n-th CMC in the first daisy chain bus, and between the k-th CMC and the k+1-th CMC in the second daisy chain bus; or,
a transmission path formed by a line between the k+2+a-th CMC and the k+1+a-th CMC in the first daisy chain bus, and between the control module and the n-th CMC, the n-th CMC and the k+2+a-th CMC, and the k+1+a-th CMC and the first CMC in the second daisy chain bus.

8. A storage battery monitoring method, applied to a control module in a storage battery monitoring system, wherein the storage battery monitoring system further comprises n cell monitoring cells (CMCs) and at least two daisy chain buses, the n CMCs are configured to monitor a plurality of cell modules electrically connected in a storage battery in one-to-one correspondence, and each CMC is configured to monitor at least one of the plurality of cell modules; the n CMCs are connected to the control module through each of the at least two daisy chain buses; and n is an integer greater than or equal to 2;
the storage battery monitoring method comprises:
receiving monitoring data of the plurality of cell modules uploaded by the n CMCs through a transmission path formed by at least one of the at least two daisy chain buses;
identifying a fault location according to the monitoring data when a fault occurring to the transmission path is detected; and
adjusting the transmission path according to the fault location so as to receive the monitoring data;
the at least two daisy chain buses comprise a first daisy chain bus and a second daisy chain bus;
the fault location comprises a first fault location between a k-th CMC and a k+1-th CMC of the first daisy chain bus, and a second fault location between a k+1+a-th CMC and a k+2+a-th CMC of the second daisy chain bus, k being an integer greater than or equal to 1, a being an integer greater than or equal to 0, and k+2+a≤n; and
the storage battery monitoring method further comprises:
adjusting the transmission path based on an adjustment basis to obtain an adjusted transmission path, the adjustment basis comprising:
switching transmission of the monitoring data from a line between the k-th CMC and the k+1-th CMC of the first daisy chain bus to a line between a k-th CMC and a k+1-th CMC of the second daisy chain bus; and
switching transmission of the monitoring data from a line between the k+1+a-th CMC and the k+2+a-th CMC of the second daisy chain bus to a line between a k+1+a-th CMC and a k+2+a-th CMC of the first daisy chain bus.

9. The storage battery monitoring method according to claim 8, wherein the control module comprises an adaptive controller and a microcontroller;
in receiving the monitoring data of the plurality of cell modules uploaded by the n CMCs through the transmission path formed by the at least one of the at least two daisy chain buses, the microcontroller receives the monitoring data uploaded by the n CMCs through the adaptive controller;
the adaptive controller identifies the fault location according to the monitoring data when the fault occurring to the transmission path is detected; and
the adaptive controller adjusts the transmission path according to the fault location to receive the monitoring data.

10. The storage battery monitoring method according to claim 9, wherein the monitoring data comprises state data of the plurality of cell modules collected by the n CMCs and a respective extremum value of each of at least one state parameter in the state data determined by the n CMCs;
after receiving the monitoring data of the plurality of cell modules uploaded by the n CMCs through the transmission path formed by the at least one of the at least two daisy chain buses, the method further comprises:
outputting, by the adaptive controller, an alarm signal when it is identified that the respective extremum value reaches a preset alarm threshold.

11. The storage battery monitoring method according to claim 10, wherein the adaptive controller is further connected to a switch in a battery circuit where the storage battery is located; and the alarm signal is a signal for controlling the switch to be turned off, so as to turn off the battery circuit.

12. The storage battery monitoring method according to claim 8, wherein in a transmission path formed by one of the first daisy chain bus and the second daisy chain bus, a CMC with a highest potential among the n CMCS is directly connected to the control module; in a transmission path formed by another one of the first daisy chain bus and the second daisy chain bus, a CMC with a lowest potential among the n CMCs is directly connected to the control module;

wherein, the CMC with the highest potential is a CMC for monitoring a cell module with the highest potential, and the CMC with the lowest potential is a CMC for monitoring a cell module with the lowest potential.

13. The storage battery monitoring method according to claim 8, wherein the monitoring data comprises state data of the plurality of cell modules collected by the n CMCs and a respective extremum value of each of at least one state parameter in the state data determined by the n CMCs;

in receiving the monitoring data of the plurality of cell modules uploaded by the n CMCs through the transmission path formed by the at least one of the at least two daisy chain buses, the state data of the plurality of cell modules is received through the transmission path formed by one of the first daisy chain bus and the second daisy chain bus, and the respective extremum value is received through the transmission path formed by another one of the first daisy chain bus and the second daisy chain bus.

14. The storage battery monitoring method according to claim 8, wherein an adjusted transmission path is:

a circular transmission path formed by a line between the control module and a first CMC, the first CMC and the k-th CMC, the k+1-th CMC and the k+2+a-th CMC in the first daisy chain bus, and between the k-th CMC and the k+1-th CMC, the k+2+a-th CMC and a n-th CMC, and the n-th CMC and the control module in the second daisy chain bus; or, a circular transmission path formed by a line between the control module and the first CMC and the first CMC and the k+1+a-th CMC in the second daisy chain bus, and between the k+1+a-th CMC and the n-th CMC and the n-th CMC the control module in the first daisy chain bus; or, a transmission path formed a line between the control module and the first CMC, the first CMC and the k-th CMC, the k+1-th CMC and the n-th CMC in the first daisy chain bus, and between the k-th CMC and the k+1-th CMC in the second daisy chain bus; or, a transmission path formed by a line between the k+2+a-th CMC and the k+1+a-th CMC in the first daisy chain bus, and between the control module and the n-th CMC, the n-th CMC and the k+2+a-th CMC, and the k+1+a-th CMC and the first CMC in the second daisy chain bus.

15. A storage battery monitoring system, comprising: n cell monitoring cells (CMCs), a control module, and two daisy chain buses; wherein n is an integer greater than or equal to 2;

the n CMCs are configured to monitor a plurality of cell modules electrically connected in a storage battery, and each CMC is configured to monitor at least one of the plurality of cell modules; the n CMCs are connected to the control module through each of the two daisy chain buses;

the control module is configured to receive monitoring data of the plurality of cell modules uploaded by the n CMCs through a transmission path formed by at least one of the two daisy chain buses;

the control module is further configured to identify a fault location according to the monitoring data when a fault occurring to the transmission path is detected, and adjust the transmission path according to the fault location so as to receive the monitoring data;

the fault location comprises a first fault location between a k-th CMC and a k+1-th CMC of one of the two daisy chain buses, and a second fault location between a k+1+a CMC and a k+2+a CMC of another one of the two daisy chain buses, k being an integer greater than or equal to 1, a being an integer greater than or equal to 0, and k+2+a≤n; and an adjusted transmission path is:

a circular transmission path formed by a line between the control module and a first CMC, the first CMC and the k-th CMC, the k+1-th CMC and the k+2+a-th CMC in the one of the two daisy chain buses, and between the k-th CMC and the k+1-th CMC, the k+2+a-th CMC and a n-th CMC, and the n-th CMC and the control module in the another one of the two daisy chain buses; or, a circular transmission path formed by a line between the control module and the first CMC and the first CMC and the k+1+a-th CMC in the another one of the two daisy chain buses, and between the k+1+a-th CMC and the n-th CMC and the n-th CMC the control module in the one of the two daisy chain buses; or, a transmission path formed a line between the control module and the first CMC, the first CMC and the k-th CMC, the k+1-th CMC and the n-th CMC in the one of the two daisy chain buses, and between the k-th CMC and the k+1-th CMC in the another one of the two daisy chain buses; or, a transmission path formed by a line between the k+2+a-th CMC and the k+1+a-th CMC in the one of the two daisy chain buses, and between the control module and the n-th CMC, the n-th CMC and the k+2+a-th CMC, and the k+1+a-th CMC and the first CMC in the another one of the two daisy chain buses.

* * * * *